(12) United States Patent
Bopp et al.

(10) Patent No.: US 7,746,639 B2
(45) Date of Patent: Jun. 29, 2010

(54) CANISTER HOUSING

(75) Inventors: Jayson K. Bopp, Fishers, IN (US); Martin G. Fix, Indianapolis, IN (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/366,540

(22) Filed: Feb. 5, 2009

(65) Prior Publication Data

US 2010/0085710 A1    Apr. 8, 2010

Related U.S. Application Data

(60) Provisional application No. 61/195,187, filed on Oct. 2, 2008.

(51) Int. Cl.
*H05K 7/20* (2006.01)

(52) U.S. Cl. .................. 361/697; 361/694; 361/695; 361/704; 174/16.1; 174/16.3; 165/80.3

(58) Field of Classification Search .................. None
See application file for complete search history.

(56) References Cited

U.S. PATENT DOCUMENTS

| | | | |
|---|---|---|---|
| 3,981,199 A | 9/1976 | Moore et al. | |
| 4,093,021 A | 6/1978 | Groom | |
| 4,312,041 A | 1/1982 | DeJonge | |
| 4,532,513 A | 7/1985 | Halvorson | |
| 4,699,208 A | 10/1987 | Wolf et al. | |
| 5,942,691 A | 8/1999 | Hopkins et al. | |
| 6,504,719 B2 * | 1/2003 | Konstad et al. | 361/698 |
| 6,741,466 B1 * | 5/2004 | Lebo | 361/679.01 |
| 7,178,390 B1 | 2/2007 | Kalovsky et al. | |
| 7,188,400 B1 | 3/2007 | Beseth et al. | |
| 7,405,932 B2 * | 7/2008 | Vinson et al. | 361/695 |
| 7,450,382 B1 * | 11/2008 | Fischer et al. | 361/695 |
| 7,460,367 B2 * | 12/2008 | Tracewell et al. | 361/679.48 |
| 7,554,805 B2 * | 6/2009 | Liu et al. | 361/695 |
| 2006/0044762 A1 * | 3/2006 | Kikuchi et al. | 361/704 |
| 2006/0060732 A1 | 3/2006 | Tannas, Jr. | |
| 2008/0094255 A1 | 4/2008 | Bethel | |

FOREIGN PATENT DOCUMENTS

DE    35 17 149 A1    5/1985

(Continued)

OTHER PUBLICATIONS

Patent Cooperation Treaty, Notification of Transmittal of the International Search Report and the Written Opinion of the International Searching Authority, or the Declaration, PCT Rule 44.1) International Application No. PCT/US2009/033381, 12 pages, Mailed Jul. 16, 2009.

(Continued)

*Primary Examiner*—Boris L Chervinsky
(74) *Attorney, Agent, or Firm*—Baker Botts L.L.P.

(57) ABSTRACT

According to one embodiment, a housing for a pedestal canister includes a first side plate and a fan. The first side plate includes a plurality of fins disposed on an exterior portion of the first side plate. The fan is coupled to the exterior portion of the first side plate. The pedestal canister is configured to be disposed within a pedestal aperture of a pedestal mounting block.

12 Claims, 11 Drawing Sheets

FOREIGN PATENT DOCUMENTS

| EP | 0 098 090 | 6/1983 |
|---|---|---|
| GB | 1 274 311 | 1/1969 |
| WO | WO 98/21093 | 5/1998 |
| WO | WO 03/080437 | 10/2003 |
| WO | WO 2007/086822 A2 | 8/2007 |
| WO | WO 2008/040783 | 4/2008 |
| WO | WO 2008/101167 | 8/2008 |

OTHER PUBLICATIONS

Patent Cooperation Treaty, Notification of Transmittal of the International Search Report and the Written Opinion of the International Searching Authority, or the Declaration, PCT Rule 44.1) International Application No. PCT/US2009/033376, 7 pages, Mailed Jul. 17, 2009.

Vicich, et al; "Aircraft Canister Design;" U.S. Appl. No. 12/366,556; 21 pages, filed Feb. 5, 2009.

Jayson K. Bopp; "Center Instrument Pedestal Display;" U.S. Appl. No. 12/366,451; 21 pages, filed Feb. 5, 2009.

Notification of Transmittal of the International Search Report and the Written Opinion of the International Searching Authority, International Application No. PCT/US2009/033371, Filing Date Jun. 2, 2009, 16 pages, Sep. 22, 2009.

Bopp, et al.; "Systems and Methods for Blind-Mate Connector Alignment;" U.S. Appl. No. 12/366,258; 33 pages, filed Feb. 5, 2009.

Bopp, et al.; "Apparatus for Supporting Instruments in an Instrumental Panel;" U.S. Appl. No. 12/366,148; 26 pages, filed Feb. 5, 2009.

Patent Cooperation Treaty, Notification of Transmittal of the International Search Report and the Written Opinion of the International Searching Authority, or the Declaration, PCT Rule 44.1) International Application No. PCT/US2009/033376, 15 pages, Mailed Nov. 19, 2009.

PCT, Notification of Transmittal of the International Search Report and the Written Opinion of the International Searching Authority, International Application No. PCT/US2009/033374, 14 pages, Jan. 20, 2010.

* cited by examiner

CANISTER HOUSING

RELATED APPLICATIONS

This application claims the benefit under 35 U.S.C. §119 (e) of U.S. Provisional Application No. 61/195,187 filed Oct. 2, 2008, entitled "Aircraft Avionics and Mission Computer Processing Canister Design."

TECHNICAL FIELD

This disclosure relates in general to aircraft instrumentation and more particularly to an instrument housing canister for an aircraft center instrument pedestal.

OVERVIEW

In some aircraft, such as F-16 fighter jets, F-15 fighter jets, A-10 attack aircraft and F-22 fighter jets, a center instrument pedestal comprises components such as instruments, gauges, and/or switches that provide information and functionality to a pilot. For example, the components may comprise altimeters, airspeed indicators, directional gyroscopes, vertical velocity indicators, navigation mode selectors, and fuel switches.

SUMMARY OF EXAMPLE EMBODIMENTS

In accordance with one embodiment of the present disclosure, a housing for a pedestal canister includes a first side plate and a fan. The first side plate includes a plurality of fins disposed on an exterior portion of the first side plate. The fan is coupled to the exterior portion of the first side plate. The pedestal canister is configured to be disposed within a pedestal aperture of a pedestal mounting block.

Numerous technical advantages are provided according to various embodiments of the present disclosure. For example, in certain embodiments, the housing may comprise a heat sink. Combining structural and cooling functionality may conserve interior canister space for other components.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

In some aircraft, such as F-16 fighter jets, F-15 fighter jets, A-10 attack aircraft and F-22 fighter jets, a center instrument pedestal comprises components such as instruments, gauges, and/or switches that provide information and functionality to a pilot. Components may be removed and installed in order to replace failed components, upgrade existing capabilities, or add new capabilities. For example, analog components may be upgraded to digital components. As another example, new components may be added to upgrade an aircraft's situational awareness capabilities.

According to various embodiments, old components may be replaced with canister modules that host new components. The new components, when combined with a display, may provide a pilot with enhanced situational awareness capabilities. For example, the display may comprise a screen that may display navigational and routing maps. Embodiments of the enhanced display may provide graphic or digital read-outs of flight information and data processed by one or more canister modules. Additionally, embodiments of the display may provide video and improved access to infrared capabilities. The canister module may be installed in an existing center pedestal without modifying the pedestal.

Embodiments of the present invention and its advantages are best understood by referring to FIGS. 1 through 6B of the drawings, like numerals being used for like and corresponding parts of the various drawings.

Figure 1:
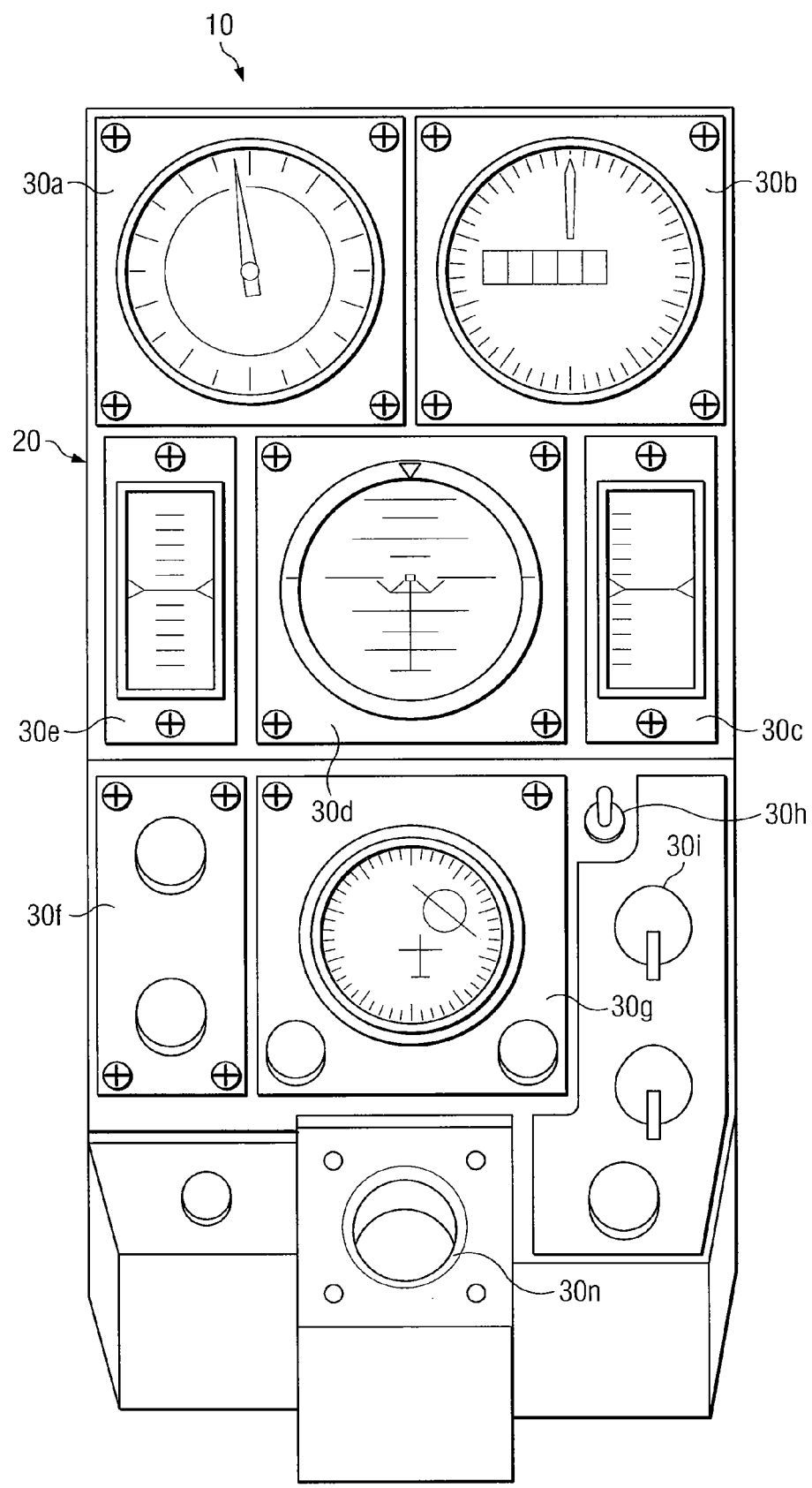
FIG. 1 is a front view illustrating an example embodiment of a center instrument pedestal.

FIG. 1 illustrates an example of a front view of a center instrument pedestal 10 for a standard F-16 aircraft. As illustrated, center instrument pedestal 10 comprises a mounting block 20 and components 30a-30n. Components 30 may comprise navigation and other flight instruments such as altimeters, airspeed indicators, directional gyroscopes, vertical velocity indicators, navigation mode selectors, and fuel switches. As illustrated in FIG. 1, components 30 comprise legacy components. It should be understood, however, that components 30 of mounting block 20 may be any type of components, such as new components, replacement components, legacy components, or a combination of any of the preceding. Replacement components may include components that substitute for other components, such as a digital component that may replace an analog component, or components used to replace a failed component, such as a component of the same type as the failed component.

Figure 2:
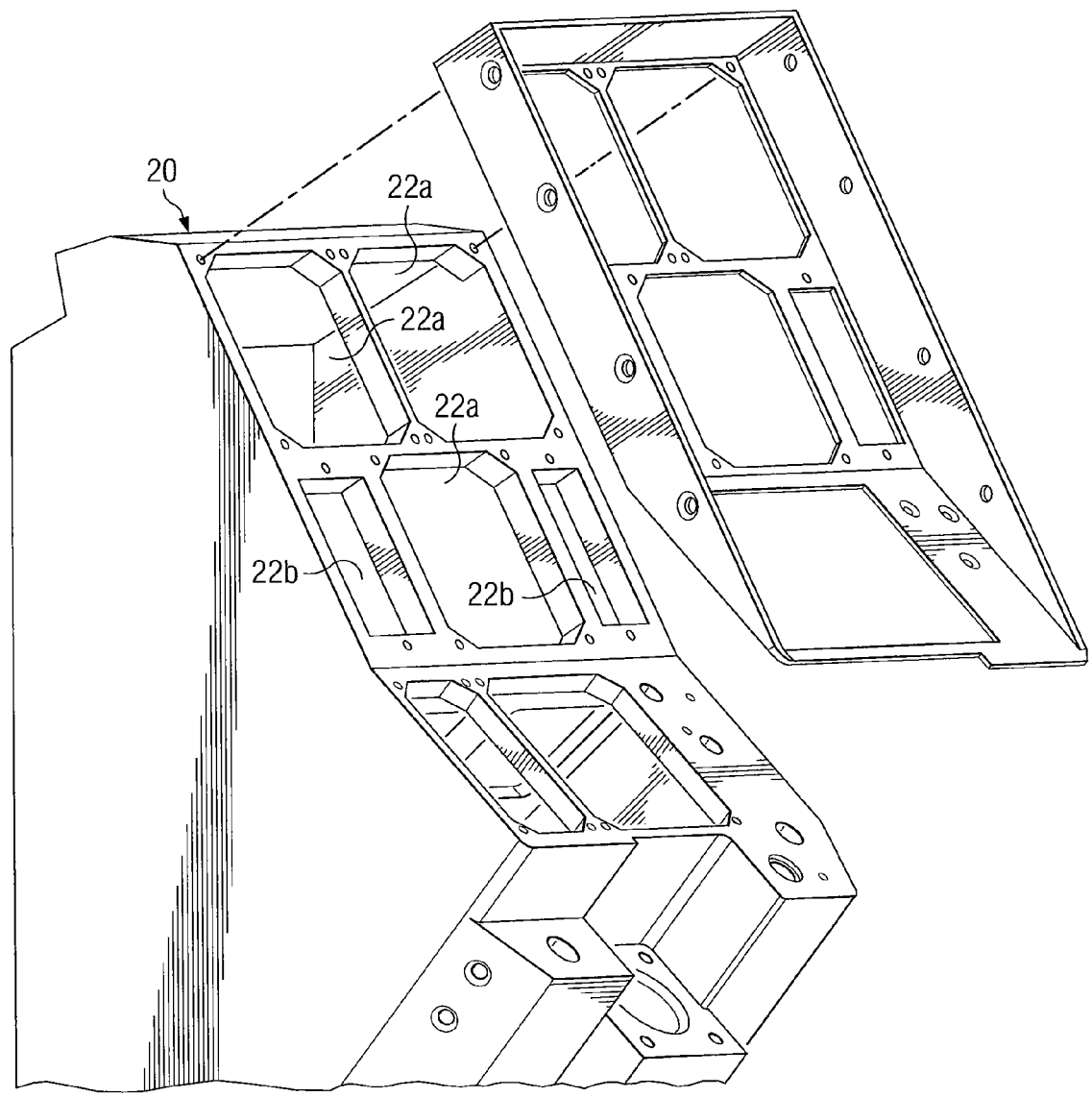
FIG. 2 is a front perspective view illustrating an example embodiment of a mounting block having legacy components removed.

FIG. 2 illustrates an example of a front view of mounting block 20. As illustrated, mounting block 20 has a surface that defines a plurality of pedestal apertures 22a-22b. As illustrated, pedestal apertures 22a-22b may be defined by the surface of mounting block 20. In a standard F-16 mounting block, the dimension of pedestal apertures 22a may be approximately 3.0 to 3.50 inches square. In some embodiments, the front of mounting block 20 may face the cockpit of the aircraft and thus be readily accessible to the pilot.

According to some embodiments, new instruments comprising one or more components may be installed in mounting block 20. For example, a component may be installed in mounting block 20 through a pedestal aperture 22. In some embodiments, inserting the new component through a pedestal aperture 22 may allow the aircraft to be upgraded from within the cockpit without modifying the structure of the aircraft. However, installing the new component through a pedestal aperture 22 and/or reusing mounting block 20 may restrict the size, shape, and/or number of components that may be installed. Additionally, the new component may need to be located in a particular position to align with and/or connect to legacy equipment of a fixed size in a fixed position within mounting block 20.

Figure 3:
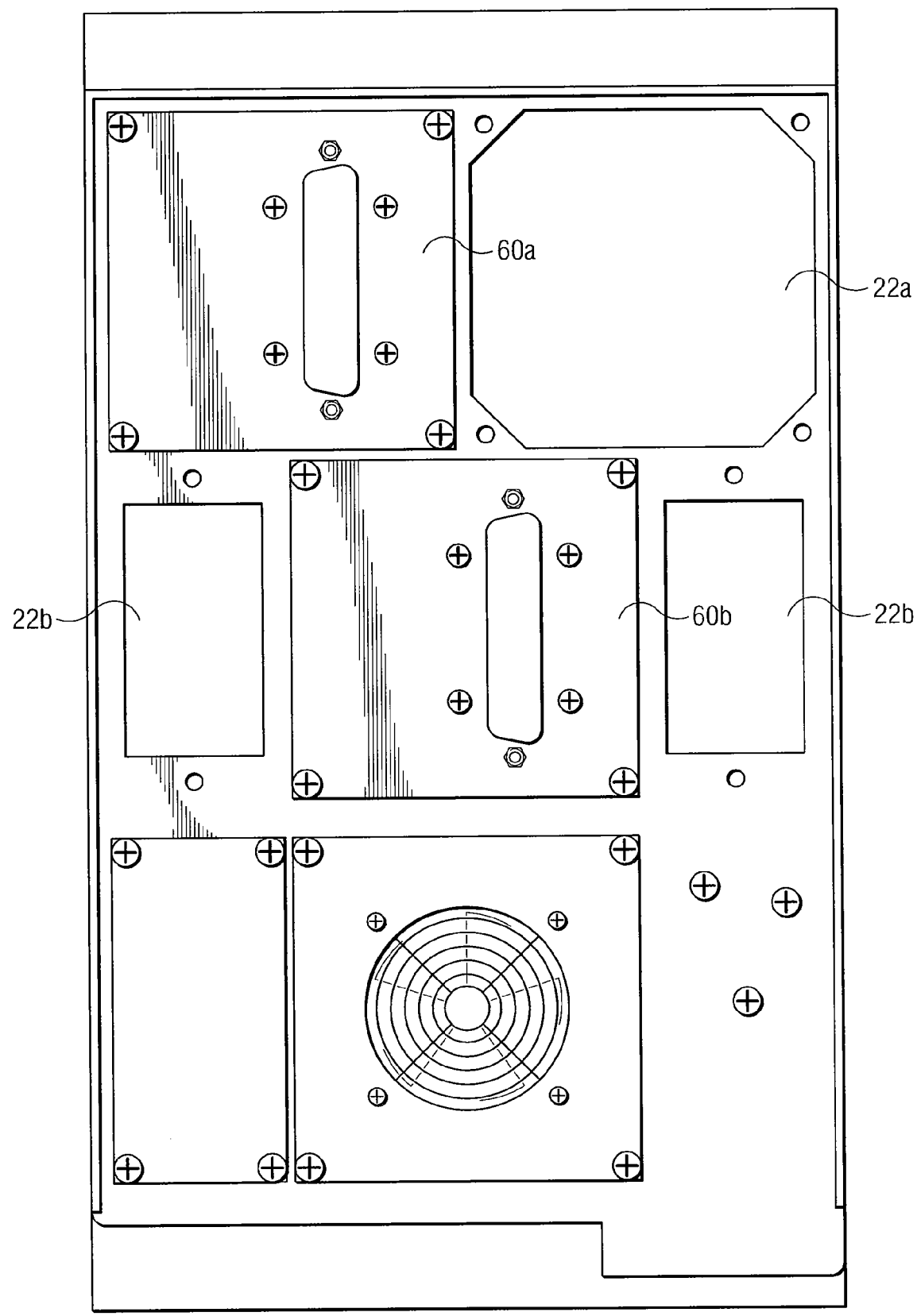
FIG. 3 is a front view illustrating an example embodiment of a mounting block populated with new components.

FIG. 3 illustrates an example of a front view of a mounting block 20 populated with components. Pedestal apertures 22 may be left unpopulated or they may be populated with any suitable components. For example, pedestal aperture 22a may be populated with a canister 60.

Canister 60 may generally provide a platform to host digital flight instruments and/or enhanced processing capabilities for mission planning and/or control. Such flight instruments and/or processing capabilities may provide feedback and/or situational awareness capabilities that may or may not be offered by components 30. Accordingly, canister 60 may provide additional or different capabilities over legacy flight instruments, while maintaining space and design parameters for an aircraft cockpit. Embodiments of canister 60 may be installed in the existing center instrument pedestal without modifying the structure of the aircraft. Specifically, the dimensions of canister module 60 may be such that canister 60 may fit through a pedestal aperture 22 of mounting block 20. Thus, embodiments of canister 60 may permit an aircraft to be upgraded from within the cockpit. Additionally, embodiments of canister 60 may be designed such that installing canister 60 does not alter the weight and/or center of gravity of a loaded center instrument pedestal. Canister 60 may also be designed using existing shock and vibration requirements for F-16 multi-function display (MFD).

In some embodiments, canisters 60 may be installed to provide certain functionality. For example, a particular canister 60 may provide processing capabilities and comprise a primary flight reference (PFR) unit or an image capture unit (ICU). As another example, a canister 60 may function to provide power to a center instrument pedestal and comprise a power distribution unit (PDU). As is described below, these canisters may vary in size from each other and may contain different components.

Figure 4:
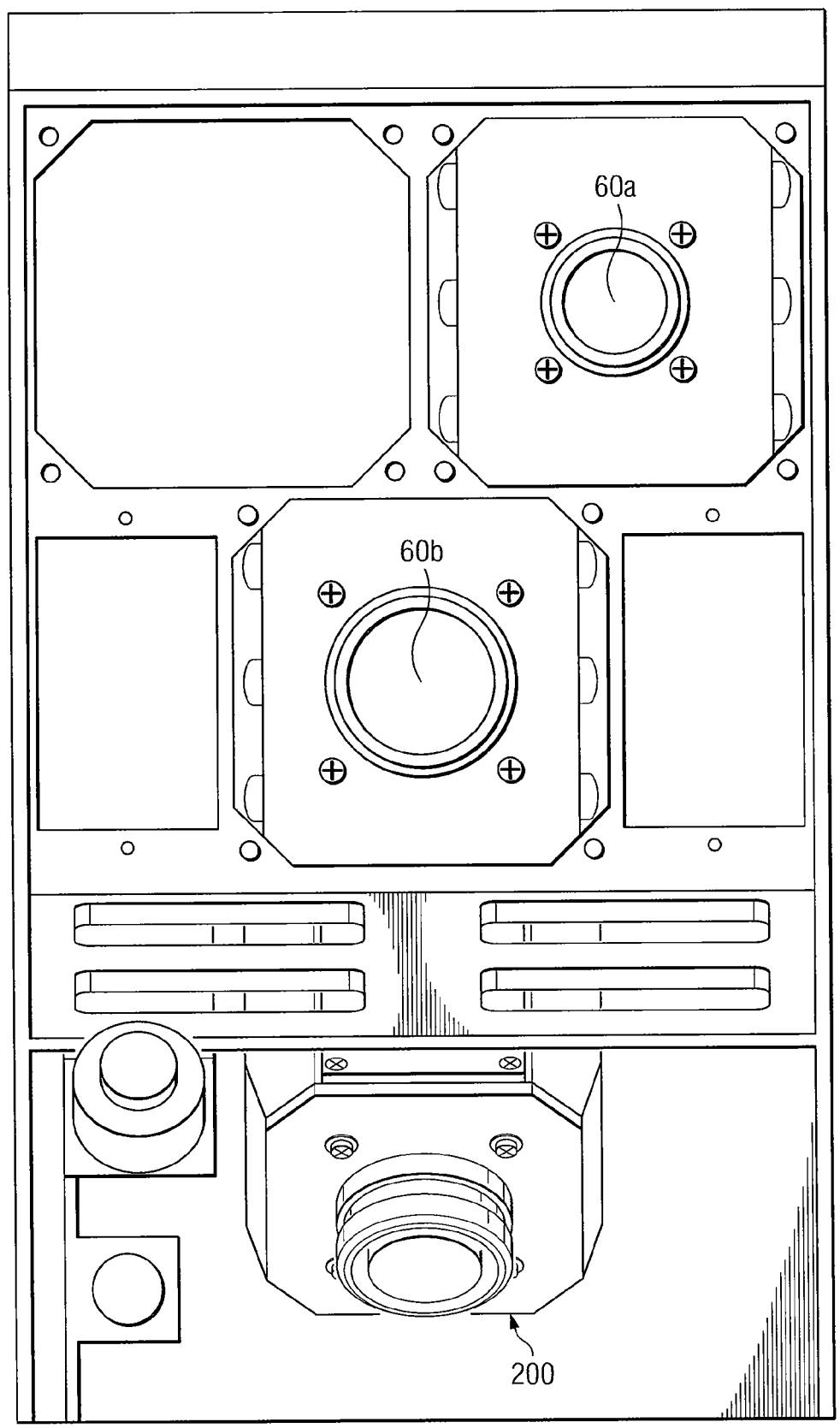
FIG. 4 is a rear view of the example mounting block illustrated in FIG. 3.

FIG. 4 illustrates a rear view of the example mounting block 20 illustrated by FIG. 3. Although FIGS. 3 and 4 illustrate a particular embodiment that includes particular components that are each configured to provide certain functionality, alternative embodiments may include any appropriate combination of components with the described functionality divided between the components in any suitable manner.

Figure 5A:
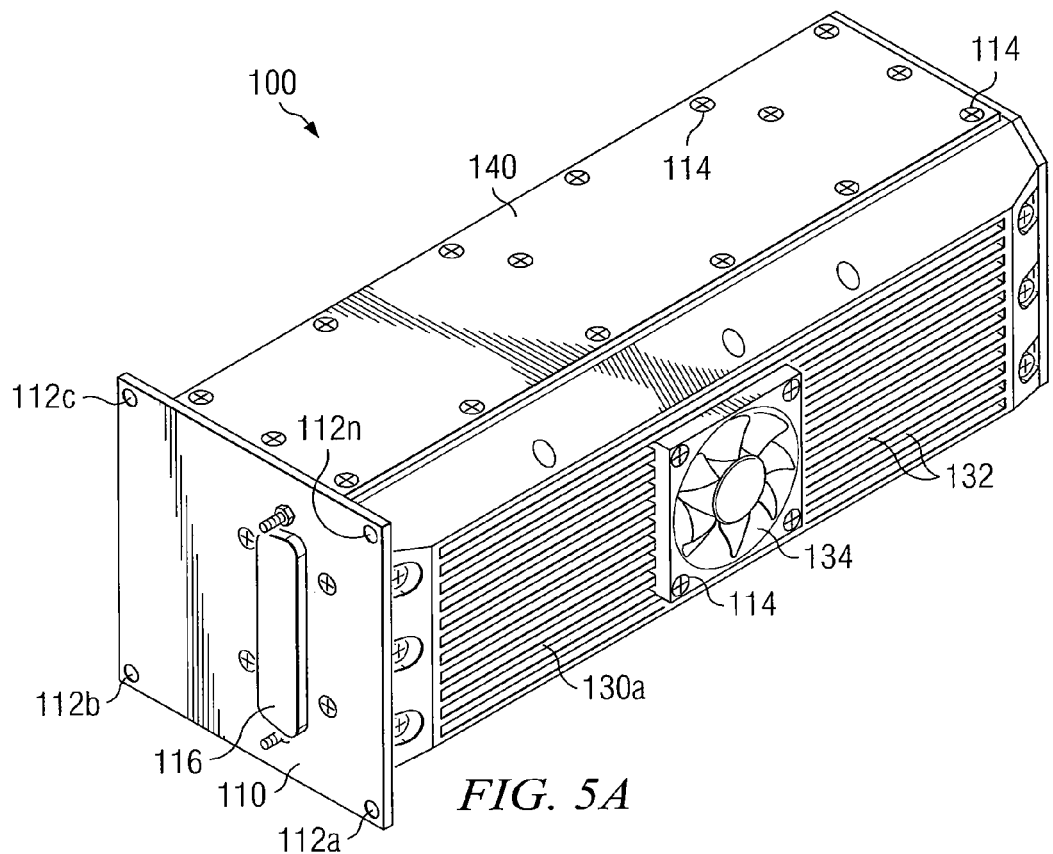
FIG. 5A is a front perspective view illustrating a housing of an embodiment of a processing canister module.
Figure 5B:
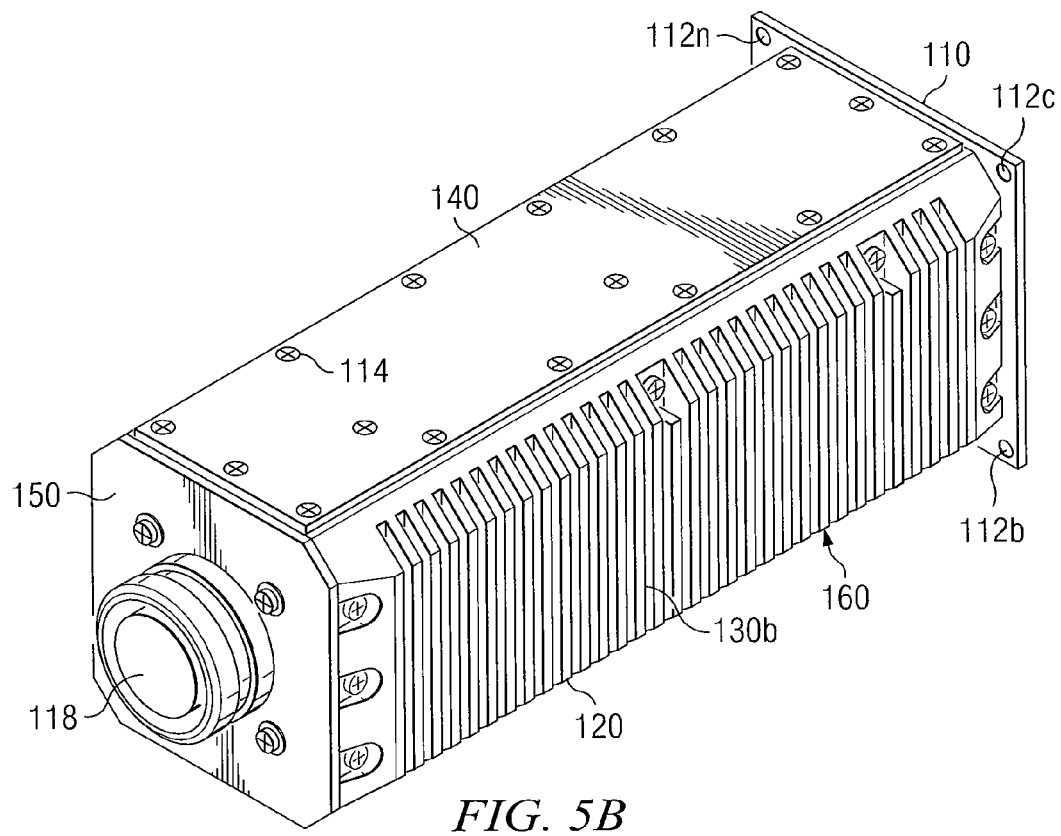
FIG. 5B is a rear perspective view illustrating a housing of an embodiment of a processing canister module.
Figure 5C:
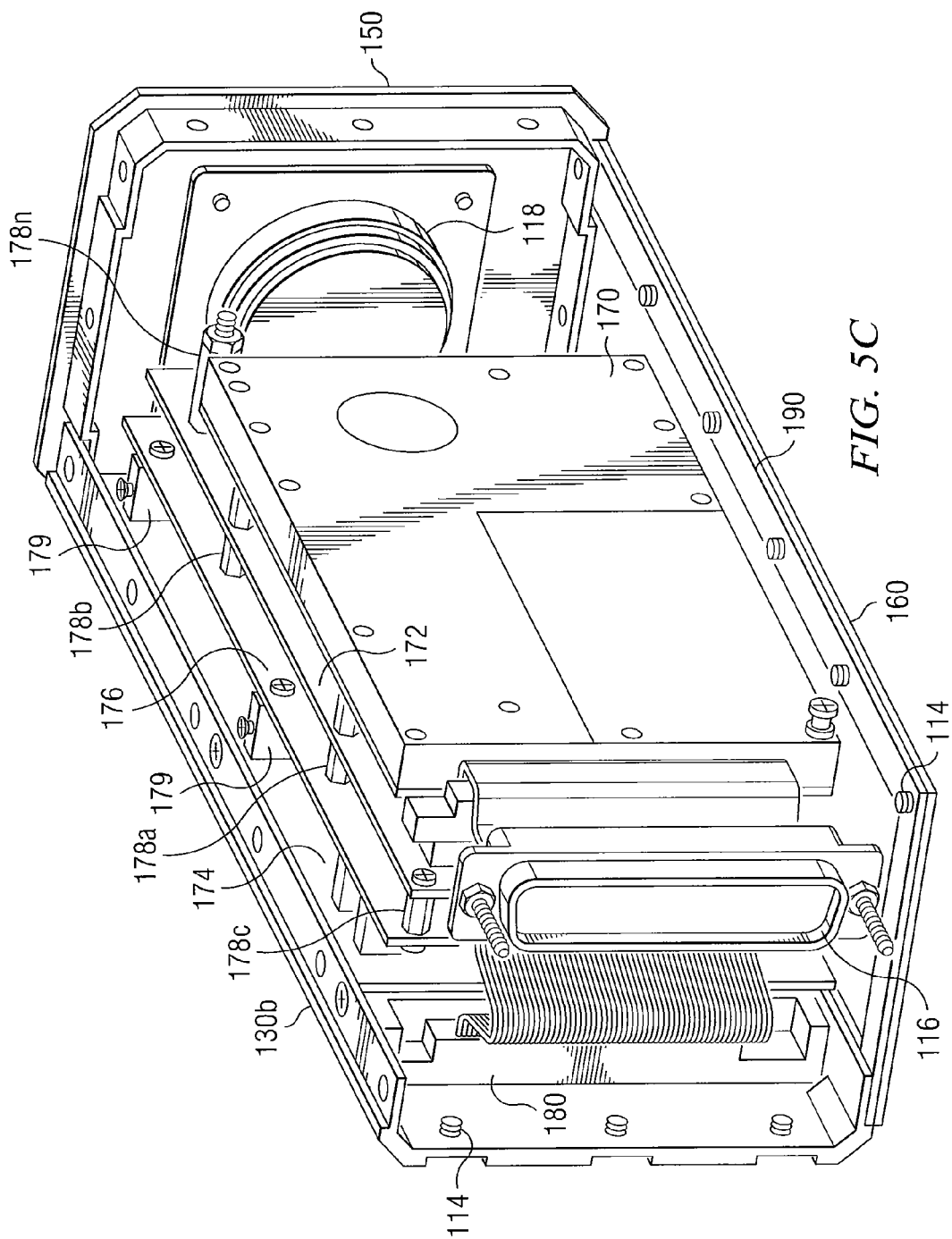
FIG. 5C is a front perspective view illustrating internal components of an embodiment of a processing canister module.
Figure 5D:
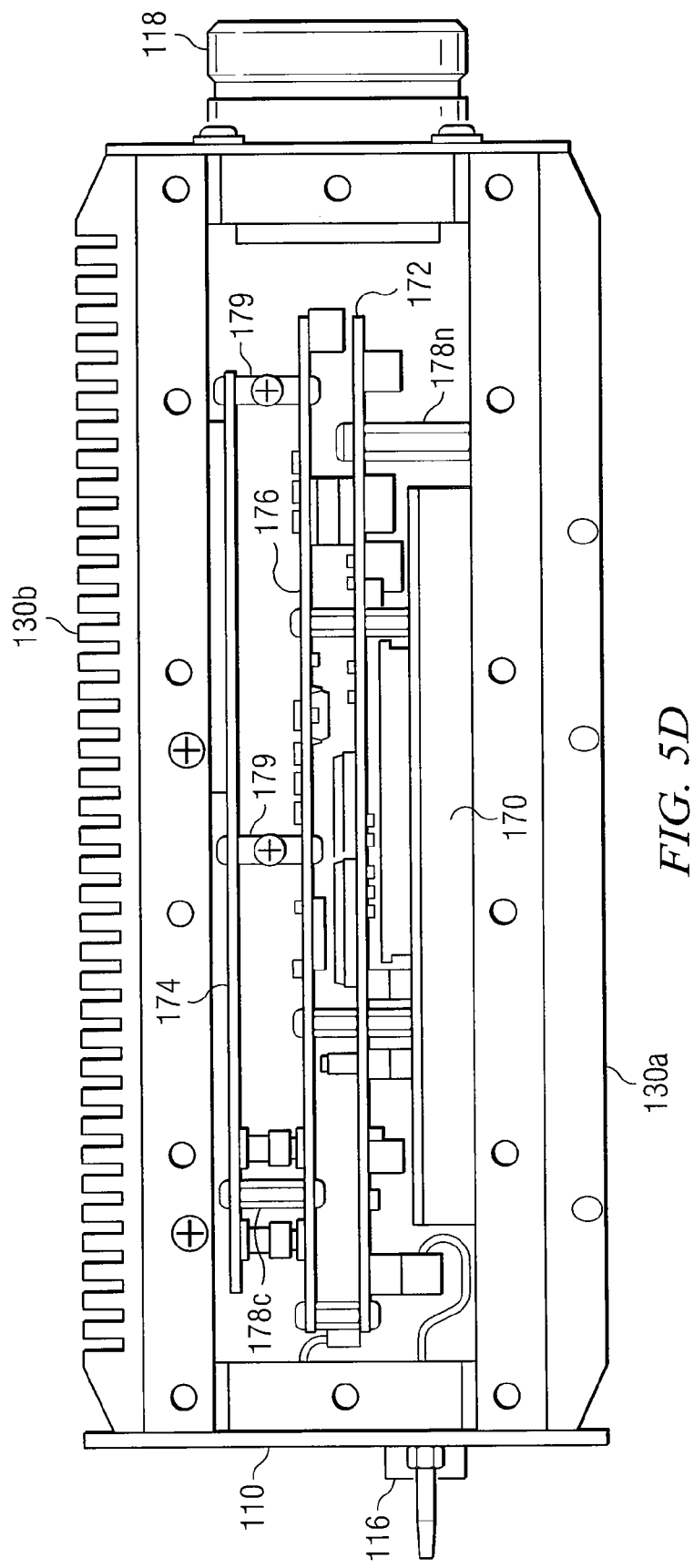
FIG. 5D is a top cross-section view illustrating an embodiment of a processing canister module.

FIGS. 5A-5D illustrate an embodiment of a processing canister 100. Processing canister 100 may comprise a PFR unit or an ICU. FIGS. 5A-5B are front and rear perspective views, respectively, illustrating a housing for components of processing canister 100. FIG. 5C is a front perspective view of example internal components of processing canister 100. FIG. 5D is a side cross-section view illustrating various internal components of processing canister 100. Although FIGS. 5A-5D illustrate a particular embodiment of a processing canister 100 that includes particular components that are each configured to provide certain functionality, alternative embodiments may include any appropriate combination of components with the described functionality divided between the components in any suitable manner.

Processing canister 100 may include any components to provide capabilities that may be supported by instruments 30. For example, processing canister 100 may include altimeters, directional gyroscopes, or air speed vertical velocity sensors. Embodiments of processing canister 100 may include one or more digital (or analog) components. Additionally, embodiments of processing canister 100 may provide functionality such as improved access to infrared sensing, navigational maps and routing information, and/or video.

With reference to FIGS. 5A-5B, the housing of processing canister 100 may comprise a mounting plate 110 and a body 120. The housing of processing canister 100 may generally function to support, provide interface to, protect, and remove heat from internal components of processing canister 100.

Mounting plate 110, in one embodiment, is used to mount processing canister 100 to a mounting block. Mounting plate 110 may comprise one or more holes 112a-112n, which may fit screws that mount processing canister 100 to a mounting block, such as mounting block 20 of FIGS. 1-4. Mounting plate 110 may also facilitate the proper alignment of processing canister 100 such that front connector 116 is positioned to mate with a corresponding connector associated with a display interface. Mounting plate 110 may be marked to identify the correct pedestal aperture to insert the processing canister 100. For example, mounting plate 110 may comprise a diagram indicating the installation location for the processing canister 100.

Front connector 116 may connect internal components of processing canister 100 to a display. For example, front connector 116 may mate with a corresponding connector of display interface 300 of FIGS. 7A-7B. Accordingly, front connector 116 may enable a visual or graphic read-out of flight data or other instrument measurements. In certain embodiments, front connector 116 may represent a male or female end of a parallel port, a USB port, or any other suitable port for transferring data or signals of any type.

Body 120 may contain one or more internal components of processing module 100. Embodiments of body 120 may comprise heat sink side plates 130a-130b, a top plate 140, a rear plate 150, and a bottom plate 160 (illustrated in FIGS. 5C-5D). In some embodiments, body 120 may be approximately 3.25"×3.25"×7.85." In other embodiments, the profile of body 120 may be between 3.15" and 3.45", and the length may be between 6" to 8". Accordingly, body 120 may fit through a pedestal aperture 22 in a mounting block 20. Thus, processing canister 100 may be used to retrofit an existing mounting block with expanded features or capabilities.

Top plate 140 and bottom plate 160 may be substantially similar. Likewise, side plates 130 may be substantially similar to each other. The plates may be manufactured from any suitable material including, but not limited to, a metal, a plastic, or a metal alloy. As illustrated, rear plate 150 may join side plates 130, top plate 140 and bottom plate 160. Rear plate 150 may also position a rear connector 118 to align and mate with a suitable component of an aircraft. Rear connector 118 may generally represent an aircraft interface that is configured to couple internal components of processing canister 100 to any aircraft components and circuitry, such as an instrument in the aircraft. Mounting plate 110, side plates 130a-130b, top plate 140, rear plate 150, and bottom plate 160 may be joined using any suitable fastening mechanism, such as one or more screws 114.

In certain embodiments, side plates 130 comprise a heat sink. Specifically, side plates 130a-130b may absorb thermal energy generated by one or more internal components of processing canister 100 and transfer the absorbed thermal energy to a fluid such as ambient air. Combining structural and cooling functions in the housing of processing canister 100 may conserve interior space for other components while also providing a mechanism for dissipating thermal energy generated by the interior components.

To facilitate the dissipation of thermal energy, embodiments of side plates 130a-130b may be manufactured from a suitable thermal conductor such as, for example, copper or an aluminum alloy. Additionally, as illustrated, side plates 130 may comprise a plurality of fins 132. Fins 132 may generally facilitate the transfer of absorbed thermal energy away from side plates 130. The thickness and spacing of fins 132 may be optimized to promote free or forced convection along the surface of side plates 130.

In certain embodiments, each side plate 130 may further comprise a fan 134. Fan 134 may assist in the dissipation of thermal energy by increasing airflow over the surface of a side plate 130. Accordingly, fan 134 may maintain a larger temperature gradient over side plates 130 by replacing warmer air more quickly than passive convection. As illustrated, fan 134 may be within a cut out on the exterior portion of a side plate 130. Accordingly, in certain embodiments, an upper surface (i.e., the surface from which air exits) of fan 134 may be below, or level with an outermost surface of side plate 130. Mounting a fan 134 to a side plate 130 in such a manner may improve the cooling of internal components of a canister module while conserving interior space within the module for such components.

FIGS. 5C-5D illustrate various internal components of processing canister 100. Internal components of processing canister may include a processor 170, a processor interface card (PIC) 172, a 1553 PCI Mezzanine Card (PMC) 174, a PMC interface card 176, memory 180, and a electromagnetic interference (EMI) gasket 190. The internal components of processing canister 100 may generally provide and support the functionality associated with processing canister 100. It should be noted that FIGS. 5C-5D are intended to illustrate example internal components of a processing canister 100 and other embodiments may include some, all, or none of the illustrated components.

Processor 170 may execute logic comprising commands and instructions associated with the services provided by processing canister module 100. Processor 170 may represent any suitable one or more devices capable of processing and/or communicating electronic information. Examples of processor 170 include, application-specific integrated circuits (ASICs), field-programmable gate arrays (FGPAs), digital signal processors (DSPs), and any other suitable specific or general purpose processors. In certain embodiments, processor 170 may comprise a single-board computer (SBC) that comprises the components of a computer on a single circuit board. Processor 170 may also include an advanced technology attachment (ATA) bus, a graphics controller, and multiple USB ports.

Processor 170 may interface with PIC 172. In operation, PIC 172 may send and/or receive data and other information to and from processor 170. PIC 172 may offer video buffering capabilities, provide a precision pressure transducer interface, and/or control analog or digital discrete interfaces. Embodiments of PIC 172 may include one or more RS-232 ports, one or more RS-422 ports, one or more (universal serial bus) USB ports, an Ethernet controller, a barometric setting circuit, and/or one or more FGPAs.

In certain embodiments, processor 170 may be mounted directly to a side plate 130. As previously described, side plate 130 may function as a heat sink. Accordingly, mounting processor 170 to a side plate 130 may facilitate the dissipation of thermal energy generated during operation. Additionally, embodiments of processor 170 may be designed to withstand a variety of environmental conditions. For example, processor 170 may withstand 90% non-condensing humidity, temperatures from −40 to 55 degrees Celsius and up to 10G shock.

In operation, processor 170 may generate flight data. The generated flight data may be based on one or more instrument readings generated by an aircraft component and received by processor 170 via rear connector 118. Flight data includes, but is not limited to an airspeed measurement, a vertical velocity measurement, an altimeter measurement, an attitude indicator, a heading indicator, and a turn and bank indicator. Additionally, in certain embodiments, processor 170 may receive video data and/or infrared measurements from suitable aircraft components and process each for display to a pilot.

PMC card 174 may be a single, dual or quad channel MIL-STD-1553 PMC card or any other suitable data bus. MIL-STD-1553 is a military standard that defines both mechanical and electrical characteristics of a serial data bus. Embodiments of PMC card 174 may be capable of simultaneously simulating a bus controller (BC), up to 31 remote terminals (RTs), and bus monitor (BM) functions including full error injection and detection.

PMC card 174 may be mounted to card mounts 179. Card mounts 179 may dissipate heat generated by PMC card 174 during operation by providing a spacing between PMC card 174 and one or more other internal components. Additionally, embodiments of PMC card 174 may also be able to operate in temperatures ranging from −40 to 85 degrees Celsius and up to 95% non-condensing humidity.

PMC interface card 176 may provide an intelligent interface between PMC card 174 and processor 170. Embodiments of PMC interface card 176 card may function as a bus controller (BC), a remote terminal (RT), a bus monitor (BM) or a remote terminal/bus monitor (RT/M). In some embodiments, PMC interface card 176 may comprise a four connector PCI interface, a PCI bus and/or a plurality of A/D channels for (direction management system/target management system) DMS/TMS.

Memory 180 may store any data or logic used by processor 170 to provide functionality for processing canister 100. In particular, embodiments of memory 180 may store software and/or code for execution by processor 170. Memory 180 may comprise any form of volatile or non-volatile memory including, without limitation, a solid state drive (SSD), magnetic media, optical media, random access memory (RAM), dynamic random access memory (DRAM), flash memory, removable media, or any other suitable local or remote component.

As illustrated in FIG. 5D, processor 170, PIC 172, PMC card 174, and PMC interface card 176 may be stacked together by card mounts 178a-178n. The stack may be generally referred to as a processing card assembly. In some embodiments, the processing card assembly may also comprise memory 180. Card mounts 178 may also fasten and properly position each of these components, or one or more other devices, to a side plate 130. In various embodiments, card mounts 178 may uniformly separate each component with a spacing of approximately 0.5".

EMI gasket 190 may line the perimeter of top plate 140 and bottom plate 160.

When processing canister 100 is positioned in a mounting block, such as mounting block 20 of FIG. 1, EMI gasket 190 may shield electrical components within the canister from electromagnetic interference generated by one or more adjacent canister modules. EMI gasket 190 may also prevent or eliminate the permeation of any electromagnetic interference generated by one or more components of processing canister 100.

While the illustrated embodiment of processing canister 100 includes a particular number and configuration of components, processing canister 100 any components which operable to provide the recited functionality. Moreover, processing canister 100 may also include additional components such as a video card or an Internet card. Accordingly, embodiments of processing canister 100 may include more, fewer, or other components.

Figure 6A:
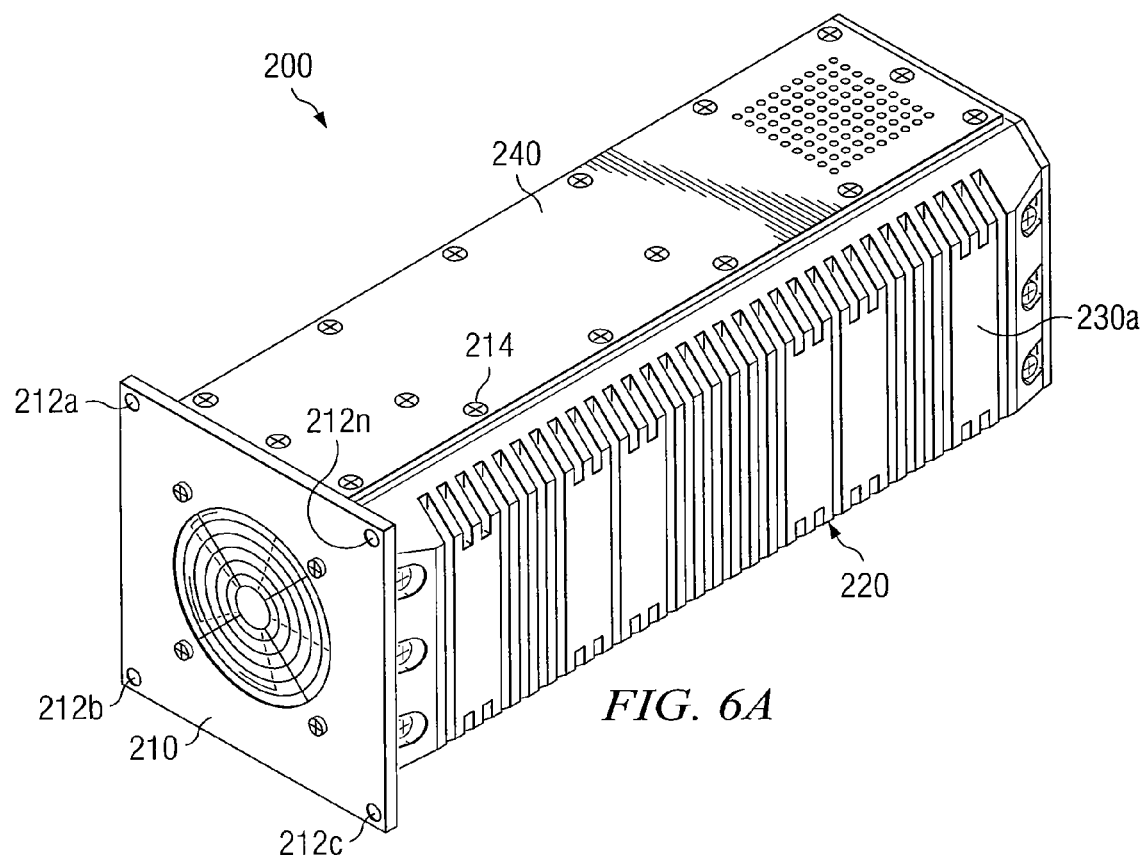
FIG. 6A is a front perspective view illustrating a housing of an embodiment of a power distribution unit (PDU) canister module.
Figure 6B:
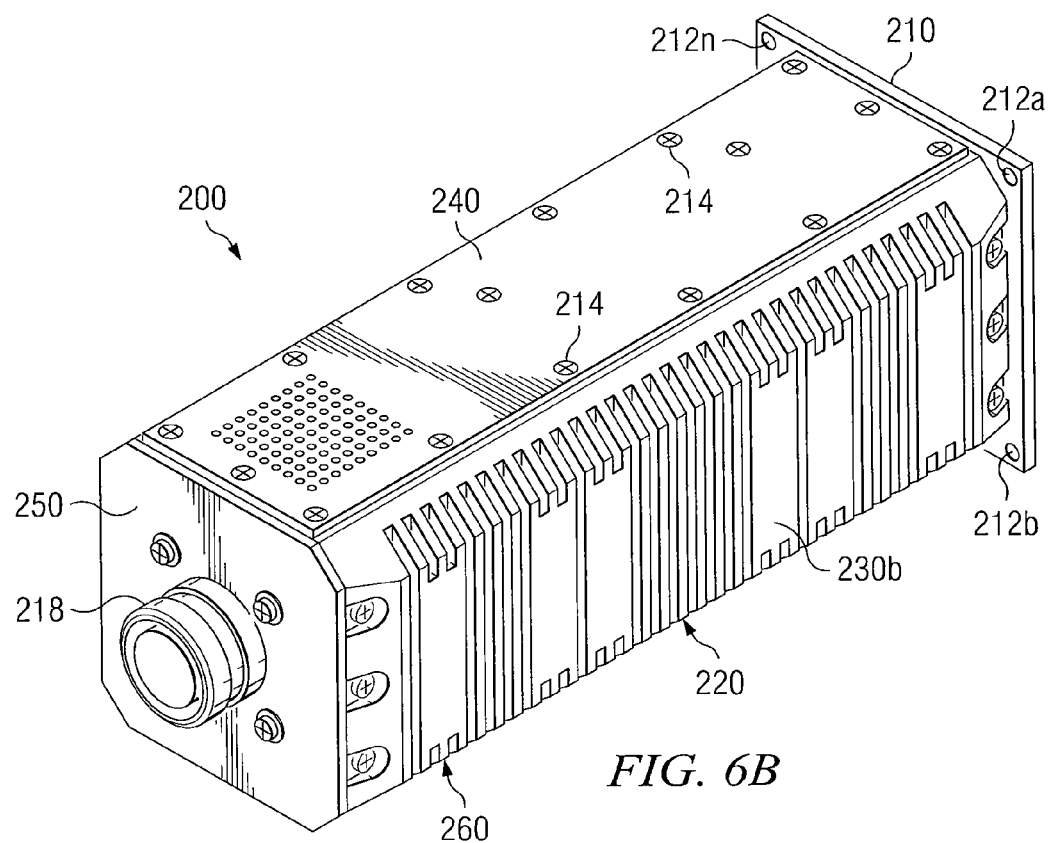
FIG. 6B is a rear perspective view illustrating a housing of an embodiment of a PDU canister module.
Figure 6C:
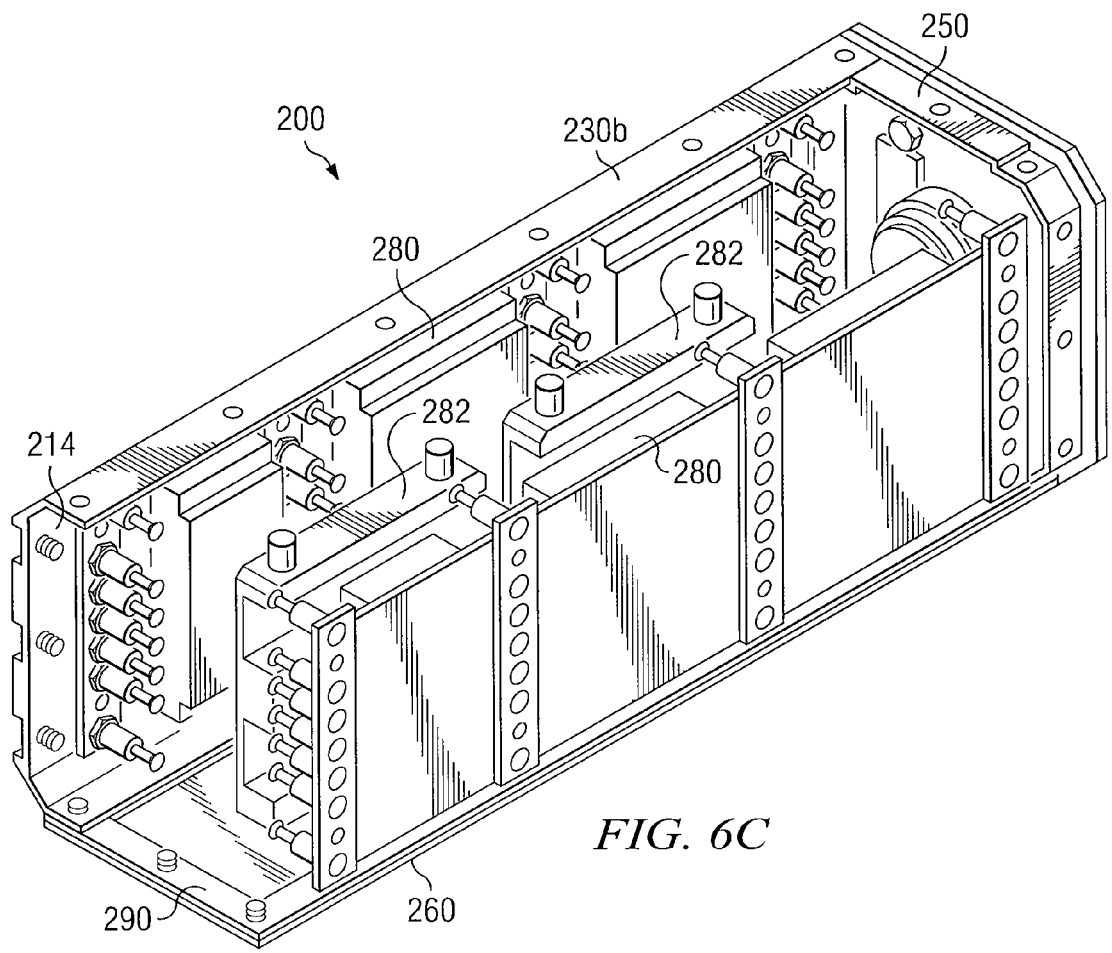
FIG. 6C is a front perspective view illustrating internal components of an embodiment of a PDU canister module.
Figure 6D:
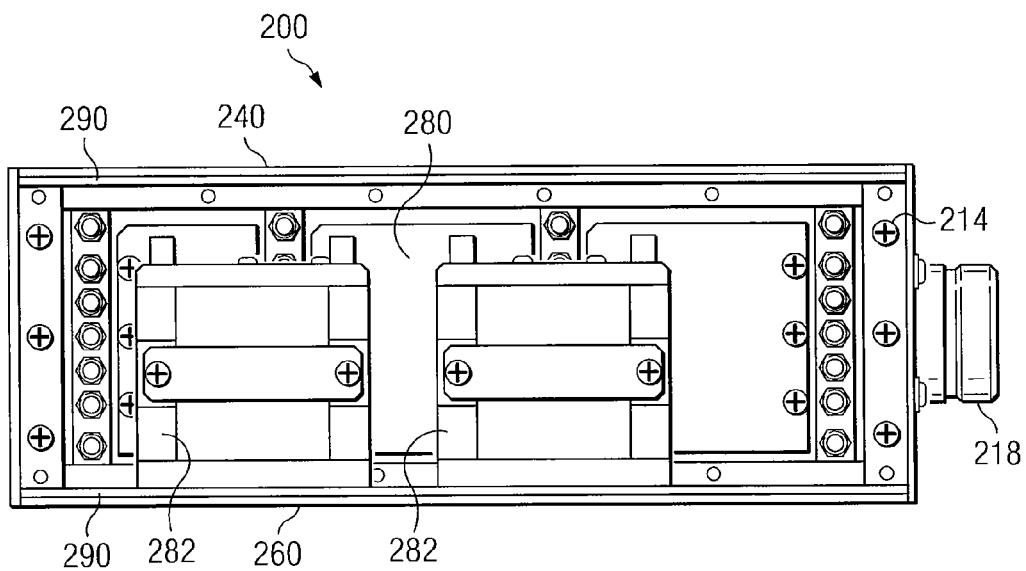
FIG. 6D is a side cross-section view illustrating an embodiment of a PDU canister module.

FIGS. 6A-6D illustrate an embodiment of a PDU canister module ("PDU canister") 200. FIGS. 6A-6B are front and rear perspective views, respectively, illustrating a housing for components of PDU canister 200. FIG. 6C is a front perspective view of internal components of PDU canister 200. FIG. 6D is a side cross-section view illustrating various internal components of PDU canister 200. Although FIGS. 6A-6D illustrate a particular embodiment of a PDU canister 200 that includes particular components that are each configured to provide certain functionality, alternative embodiments may include any appropriate combination of components with the described functionality divided between the components in any suitable manner.

With reference to FIGS. 6A-6B, the housing of PDU canister 200 may comprise a mounting plate 210 and a body 220. The housing of PDU canister 200 may generally function to support and protect internal components of PDU canister 200.

Mounting plate 210 may comprise one or more holes 212a-212n, which may fit screws that mount PDU canister 200 to a mounting block, such as mounting block 20 of FIGS. 1-4. In addition to mounting PDU canister 200 to a mounting block, mounting plate 210 may also ensure the proper alignment of PDU canister 200 within the mounting block.

Body 220 generally comprises side plates 230a-230b, a top plate 240, a rear plate 250, and a bottom plate 260 (illustrated in FIGS. 6C-6D). In some embodiments, body 220 may be approximately 3.25"×3.25"×9." In particular embodiments, the profile of body 220 may be between 3.15" and 3.45", and the length may be between 6" to 8". Accordingly, body 220 may fit through a pedestal aperture 22 in a mounting block 20.

Side plates 230, top plate 240, rear plate 250, and bottom plate 260 may be substantially similar to side plates 130, top plate 140, rear plate 150, and bottom plate 160 of processing module 100 illustrated in FIGS. 5A-5D. These components may be connected using one or more screws 214.

In the illustrated embodiment, side plates 230 do not include a fan. However, it should be noted that embodiments of side plates 230 may include one or more fans such as fan 134 described with respect to canister module 100. Additionally, embodiments of side plates 230, top plate 240, rear plate 250, and bottom plate 260 may vary in size from side plates 130, top plate 140, rear plate 150, and bottom plate 160 of canister module 100.

PDU module 200 may also comprise a rear connector 218. Rear connector 218 may interface with aircraft components and circuitry. Embodiments of rear connector 218 may be substantially similar to rear connector 118 of processing module 100.

Referring now to FIGS. 6C-6D, various internal components of an embodiment of PDU module 200 are illustrated. As discussed above, embodiments of PDU module 200 may provide power to components of a center pedestal display, such as one or more processing modules 100. Accordingly, PDU module 200 may comprise a plurality of power modules 280 and a plurality of capacitors 282. Power modules 280 may be any suitable power generating device, such as one manufactured by Vicor®. In operation, power modules 280 may generate power that is stored by capacitors 282. In one embodiment, one or more power modules 280 may be used to condition and filter the incoming aircraft power.

As illustrated, power modules 280 may line side plates 230. During operation, power modules 280 may generate thermal energy. Similar to side plates 130 of processing canister 100, side plates 230 may also function as heat sinks. Accordingly, mounting power modules to side plate 230 facilitate the dissipation of thermal energy away from power modules 280. Thus, embodiments side plates 230 may offer both structural and cooling functions.

PDU module 200 may also comprise an EMI gasket 290. Similar to EMI gasket 190 of processing module 100, EMI gasket 290 may shield electrical components within the canister from electromagnetic interference generated by one or more adjacent components. EMI gasket 290 may also prevent or eliminate the permeation of any electromagnetic interference generated by one or more components of PDU canister 200.

Figure 7A:
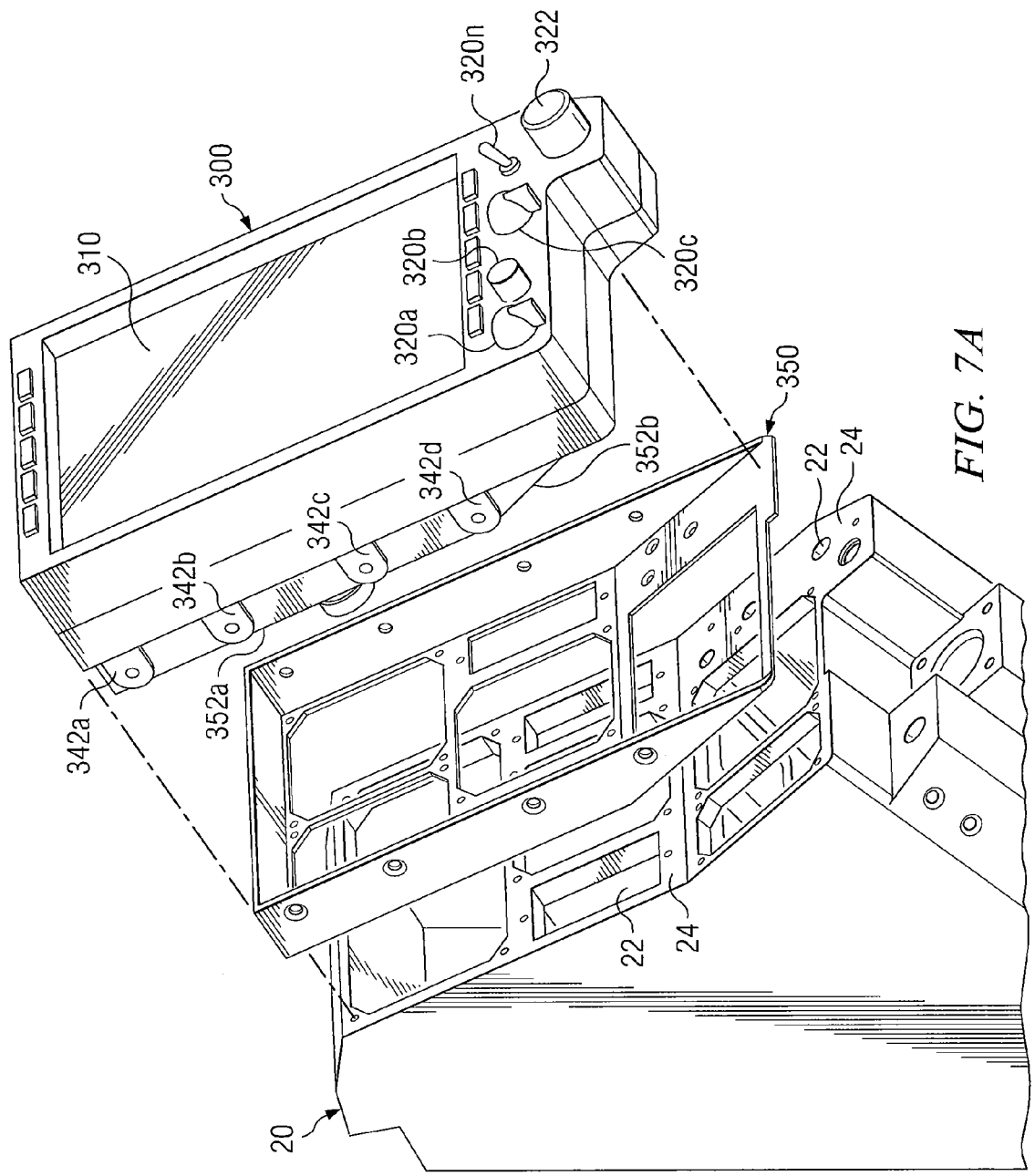
FIG. 7A is a front perspective view illustrating an embodiment of a display interface.
Figure 7B:
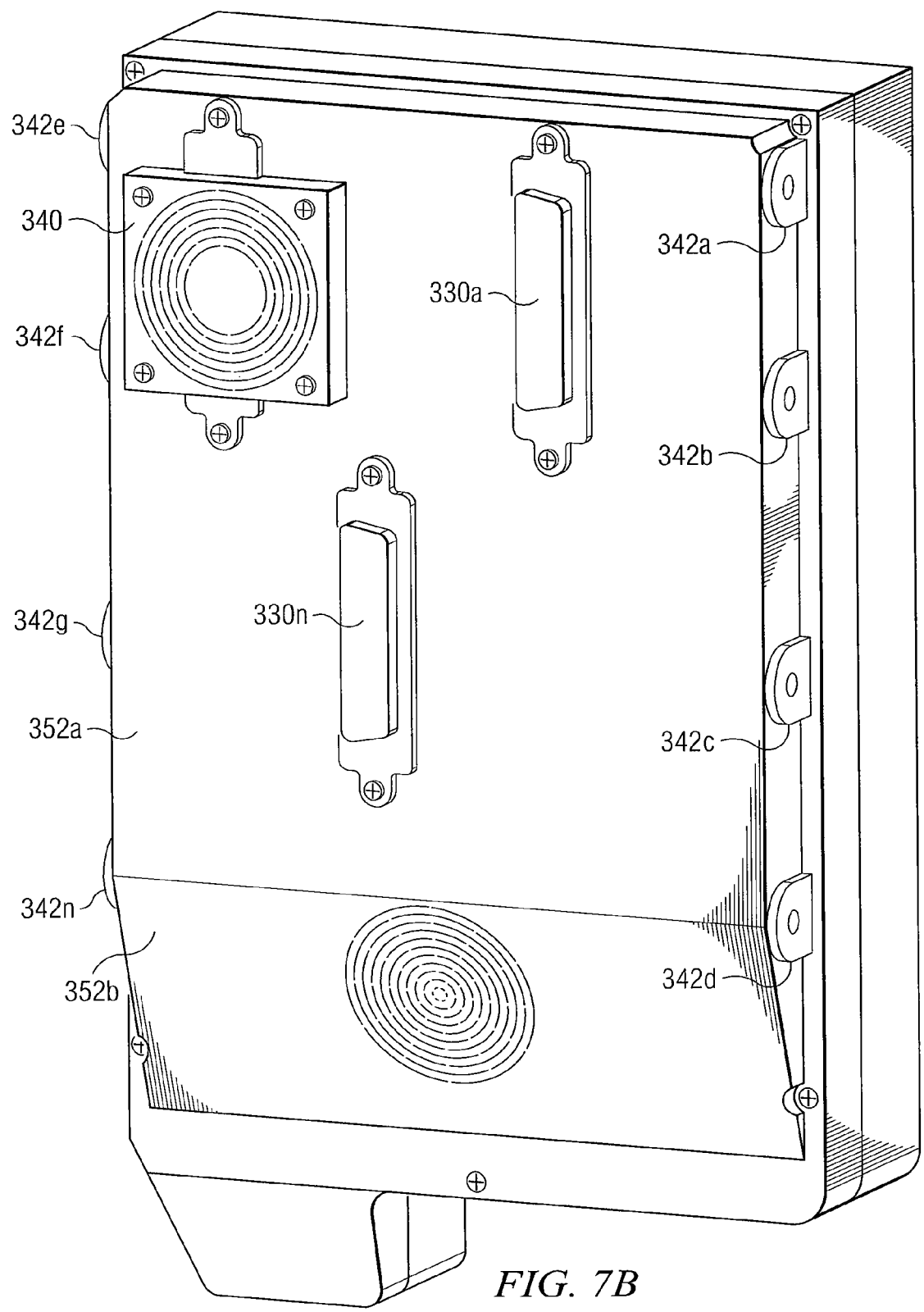
FIG. 7B is a rear perspective view illustrating an embodiment of a display interface.

FIGS. 7A-7B illustrate an embodiment of a display interface 300 that may be fitted to an existing center instrument pedestal. FIG. 7A is a top perspective view of display interface 300 positioned over mounting block 20. FIG. 7B is a bottom perspective view of display interface 300 illustrating connectors 330a-n that may mate with corresponding connectors associated with one or more processing canisters 100 or PDU canisters 200.

Embodiments of display interface 300 may be sized and shaped so as to fit on mounting block 20 without interfering with other functions and capabilities needed by a pilot. In various embodiments, display interface 300 may comprise a plurality of mounting faces 352a-352b. Each mounting face may be configured such that it is substantially parallel to a corresponding surface on a face 24 of mounting block 20. In some embodiments, display interface 300 may mate to a display mount 350 via a plurality of fasteners 342, which may secure display interface 300 to display mount 350. In such embodiments, the display mount 350 may be installed on the mounting block of the center instrument pedestal and display interface 300 may be mounted to display mount 350. It should be noted that the size and shape of display interface 300 may generally be such that it does not interfere with a pilot climbing in and out of an aircraft cockpit.

Display interface 300 may comprise appropriate hardware and/or software to provide a pilot with situational awareness capabilities. For example, display interface 300 may comprise a screen 310, which may display information and capabilities to a pilot. Embodiments of screen 310 may provide a digital display of some or all of the information and capabilities provided by components 30 of FIG. 1. In some embodiments, screen 310 comprise a graphical user interface (GUI) with a touch-screen interface for pilot instrument control. In certain embodiments, the display mode or other settings for screen 310 may be adjusted using a controller that is positioned on the throttle and/or stick of the aircraft.

Embodiments of display interface 300 may provide a pilot display that is larger than standard pilot displays, such as F-16 displays. Specifically, in some embodiments, screen 310 may provide a 10.4" display in an area normally expected to house an 8.4" screen without protruding beyond the width of an existing center pedestal. Providing a larger screen 310 may permit embodiments of display interface 300 to provide enhanced situational awareness capabilities. For example, screen 310 may display larger and more detailed route and guidance maps than a traditional screen.

Some embodiments of display interface 300 also comprises a plurality of switches 320a-320n. Switches 320 may provide any suitable functionality for a center instrument pedestal, such as functionality associated with existing switches. For example, switches 320 may comprise one or more fuel switches or navigational mode selectors. In various embodiments, switches 320 may be positioned on a common side of display interface 300. Positioning such components on a common side of display interface 300 may generally allow screen 310 to comprise a larger area than otherwise because only one dimension of screen 310 is constrained. Accordingly, as illustrated in FIG. 7A, screen 310 may overlap one or more pedestal apertures 22 of mounting block 20 where one or more legacy switches were previously installed.

Embodiments of display interface may also comprise one or more USB ports 322. USB port 322 may enable a pilot to download mission data to display interface 300. USB port 322 may also enable a pilot to upload mission data from display interface 300. In some embodiments, USB port 322 may allow for one or more other instruments to interface with display interface 300

Referring to FIG. 7B, display interface 300 may also comprise a plurality of connectors 330. Each connectors 330 may comprise a blind mate connector that mates with a front connector 116 of a processing canister 100. In this manner, display interface 300 may receive flight data recorded and/or generated by a processing canister 100. In some embodiments, the received data may be pre-processed by a processing canister 100 such that the received data is ready for display on screen 310. In alternative embodiments, the received data may be processed by display interface 300 for display on screen 310.

Some embodiments of display interface 310 may comprise one or more cooling fans 340. Cooling fan 340 may be installed in display interface in lieu of a connector 330. Cooling fan may draw heat away from components of display interface 300.

Although FIGS. 7A-7B illustrate a particular embodiment of a display interface 300 that includes a particular number and arrangement of components configured to provide certain functionality, alternative embodiments may include any appropriate combination of components with the described functionality divided between the components in any suitable manner. Additionally, embodiments of display interface may include more, fewer, or other components.

While the present invention has been described in detail with reference to particular embodiments, numerous changes, substitutions, variations, alterations and modifications may be ascertained by those skilled in the art, and it is intended that the present invention encompass all such changes, substitutions, variations, alterations and modifications as falling within the spirit and scope of the appended claims.

What is claimed is:

1. A housing for a pedestal canister, the housing comprising:
a first side plate, the first side plate comprising a plurality of fins disposed on an exterior portion of the first side plate; and
a fan, the fan coupled to the exterior portion of the first side plate;
wherein the pedestal canister is configured to be disposed within a pedestal aperture of a pedestal mounting block.

2. The housing of claim 1, wherein an incoming air surface of the fan is closer to the interior of the housing than an outermost surface of the exterior portion of the first side plate.

3. The housing of claim 1, wherein an incoming air surface of the fan is level with an outermost surface of the exterior portion of the first side plate.

4. The housing of claim 1, wherein the first side plate has a surface that defines a cut out, the fan disposed within the cut out.

5. The housing of claim 1, wherein a processor is mounted to an interior surface of the first side plate.

6. The housing of claim 1, wherein a plurality of power modules are mounted to an interior surface of the first side plate.

7. The housing of claim 1, further comprising:
a second side plate, the second side plate substantially parallel to the first side plate; and
a plurality of fins disposed on an exterior portion of the second side plate.

8. The housing of claim 1, further comprising:
an upper plate;
a lower plate, the lower plate substantially parallel to the upper plate;
a second side plate, the second side plate substantially parallel to the first side plate;
and a mounting plate, the mounting plate coupled to the housing and configured to mount the pedestal canister to the mounting block.

9. The housing of claim 1, wherein the first side plate comprises a thermal conductor.

10. The housing of claim 1, wherein the first side plate is configured to absorb thermal energy generated by a processor.

11. The housing of claim 1, wherein the first side plate is configured to absorb thermal energy generated by a power module.

12. The housing of claim 1, wherein:
a processor is mounted to an interior surface of the first side plate; and
a plurality of power modules are mounted to the interior surface of the first side plate.

* * * * *